United States Patent
Wu et al.

(10) Patent No.: US 12,284,800 B2
(45) Date of Patent: Apr. 22, 2025

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei (CN)

(72) Inventors: Gongyi Wu, Hefei (CN); Yong Lu, Hefei (CN); Longyang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 749 days.

(21) Appl. No.: 17/404,056

(22) Filed: Aug. 17, 2021

(65) Prior Publication Data
US 2022/0052052 A1 Feb. 17, 2022

Related U.S. Application Data

(63) Continuation of application No. PCT/CN2021/100457, filed on Jun. 6, 2021.

(30) Foreign Application Priority Data

Aug. 14, 2020 (CN) .......................... 202010816422.1

(51) Int. Cl.
*H10D 62/10* (2025.01)
*H10B 12/00* (2023.01)
(Continued)

(52) U.S. Cl.
CPC ........... *H10B 12/34* (2023.02); *H10B 12/053* (2023.02); *H10B 12/488* (2023.02);
(Continued)

(58) Field of Classification Search
CPC ...... H10B 12/34; H10B 12/053; H10B 12/31; H01L 29/4238; H01L 29/4236;
(Continued)

(56) References Cited

U.S. PATENT DOCUMENTS 10,083,906 B1 9/2018 Jen
10,217,750 B1 2/2019 Lin
(Continued)

FOREIGN PATENT DOCUMENTS

CN 101154685 B 6/2010
CN 101174648 B 9/2015
(Continued)

OTHER PUBLICATIONS

Merriam-Webster.com Dictionary, Merriam-Webster, https://www.merriam-webster.com/dictionary/sandwich. Accessed May 23, 2024 (Year: 2024).*

(Continued)

*Primary Examiner* — Nicholas J Tobergte
*Assistant Examiner* — William Henry Anderson
(74) *Attorney, Agent, or Firm* — Kilpatrick Townsend & Stockton LLP (57) ABSTRACT

A semiconductor structure and a method for manufacturing the semiconductor structure are provided. The semiconductor structure includes a substrate, a trench and a word line. The substrate includes an isolation structure and an active area. The active area includes irons of a first type. The trench is arranged in the active area, an inner surface of the trench includes an inversion doping layer and an oxide layer which are arranged adjacent to each other, and the inversion doping layer is arranged above the oxide layer. The word line is arranged in the trench. The inversion doping layer includes ions of a second type. The first type is contrary to the second type.

9 Claims, 7 Drawing Sheets

(51) Int. Cl.
*H10D 64/27* (2025.01)
*H10D 62/17* (2025.01)

(52) U.S. Cl.
CPC ......... *H10D 64/513* (2025.01); *H10D 62/102* (2025.01); *H10D 62/112* (2025.01); *H10D 62/235* (2025.01); *H10D 62/292* (2025.01)

(58) Field of Classification Search
CPC ........... H01L 21/32136; H01L 21/0217; H01L 29/42368; H01L 21/28088; H01L 29/4966; H01L 29/4991; H01L 21/67075; H01L 21/31056; H01L 29/515
See application file for complete search history.

(56) References Cited

U.S. PATENT DOCUMENTS

| | | | |
|---|---|---|---|
| 2006/0043457 A1 | 3/2006 | Baik | |
| 2006/0249773 A1* | 11/2006 | Kai | H01L 29/66181 257/E21.654 |
| 2006/0263970 A1* | 11/2006 | Jang | H10B 12/0385 257/296 |
| 2013/0029465 A1 | 1/2013 | Lee | |
| 2013/0062679 A1* | 3/2013 | Manabe | H10B 12/02 257/306 |
| 2013/0248989 A1* | 9/2013 | Lee | H10D 62/299 438/270 |
| 2015/0349073 A1 | 12/2015 | Kang | |
| 2016/0336414 A1 | 11/2016 | Kang | |
| 2018/0212055 A1* | 7/2018 | Chen | H10D 30/63 |
| 2019/0067293 A1 | 2/2019 | Lin et al. | |
| 2019/0164977 A1 | 5/2019 | Lin et al. | |
| 2020/0176452 A1* | 6/2020 | Ting | H10B 12/34 |
| 2021/0066466 A1* | 3/2021 | Kwon | H01L 29/4238 |

FOREIGN PATENT DOCUMENTS

| | | | |
|---|---|---|---|
| CN | 108565263 A | | 9/2018 |
| CN | 108899309 A | | 11/2018 |
| CN | 208923143 U | * | 5/2019 |
| CN | 110299324 A | | 10/2019 |

OTHER PUBLICATIONS

Merriam-Webster.com Dictionary, Merriam-Webster, https://www.merriam-webster.com/dictionary/between. Accessed May 23, 2024 (Year: 2024).*
Translation of CN-208923143-U (Year: 2019).*
Supplementary European Search Report in European application No. 21783384.7, mailed on May 24, 2022, 7 pgs.
International Search Report in the international application No. PCT/CN2021/100457, mailed on Sep. 15, 2021, 2 pgs.
Written Opinion PCT/CN2021/100457, mailed on Sep. 15, 2021, 8 pages.
First Office Action of the European application No. 21783384.7, issued on Mar. 1, 2023, 5 pages.

* cited by examiner

SEMICONDUCTOR STRUCTURE AND METHOD FOR MANUFACTURING SEMICONDUCTOR STRUCTURE

CROSS-REFERENCE TO RELATED APPLICATIONS

This is a continuation application of International Patent Application No. PCT/CN2021/100457, filed on Jun. 16, 2021, which claims priority to Chinese Patent Application No. 202010816422.1, filed on Aug. 14, 2020 and entitled "SEMICONDUCTOR STRUCTURE AND METHOD FOR MANUFACTURING SEMICONDUCTOR STRUCTURE". The disclosures of International Patent Application No. PCT/CN2021/100457 and Chinese Patent Application No. 202010816422.1 are incorporated by reference herein in their entireties.

TECHNICAL FIELD

The disclosure relates to the technical field of a semiconductor, in particular to a semiconductor structure and a method for manufacturing the semiconductor structure.

BACKGROUND

A Dynamic Random Access Memory (DRAM) is a common semiconductor device in an electronic device such as a computer, and includes a memory cell array for storing data and a peripheral circuit arranged on a periphery of the memory cell array. Each memory cell usually includes a transistor (word line), a bit line and a capacitor. A word line voltage on the transistor (word line) can control turning on and turning off of the transistor, so that the data information stored in the capacitor can be read on the bit line, or the data information can be written into the capacitor through the bit line.

With the development of the manufacturing process, a feature size of a Metal Oxide Semiconductor (MOS) is continuously reduced, and the intensity of a transverse electric field of a channel of an MOS device is continuously enhanced. During operation of a semiconductor word line transistor (for example, an N-channel Metal Oxide Semiconductor (NMOS)), due to the combined effect of a drain voltage (Vdd) and a gate voltage (Vg), a strong electric field is formed near the drain, so that the damage of a hot carrier to the device mainly occurs in an oxide layer close to the drain, thereby resulting in a drift of a switching characteristic of a transistor switch and serious degradation of reliability of the device.

SUMMARY

The disclosure provides a semiconductor structure and a method for manufacturing the semiconductor structure, so as to improve the performance of the semiconductor structure.

According to a first aspect of the disclosure, a semiconductor structure is provided, which includes:
a substrate including an isolation structure and an active area, the active area including ions of a first type;
a trench arranged in the active area, an inner surface of the trench including an inversion doping layer and an oxide layer which are arranged adjacent to each other, and the inversion doping layer being arranged above the oxide layer; and
a word line arranged in the trench.

The inversion doping layer includes ions of a second type. The first type is contrary to the second type.

According to a second aspect of the disclosure, a method for manufacturing a semiconductor structure is provided, which includes the following operations.

A substrate including an isolation structure and an active area is provided, in which the active area is doped with ions of a first type.

A trench is formed in the active area, in which an inversion doping layer and an oxide layer are formed in the trench, and the inversion doping layer is arranged above the oxide layer.

A word line is formed in the trench.

The inversion doping layer is doped with ions of a second type. The first type is contrary to the second type.

BRIEF DESCRIPTION OF THE DRAWINGS

By considering the following detailed description of the preferred implementations of the disclosure in conjunction with the accompanying drawings, various objectives, features, and advantages of the disclosure will become more apparent. The drawings are merely exemplary illustrations of the disclosure, and are not necessarily drawn to scale. In the drawings, the same reference numerals always denote the same or similar parts, in which.

Reference numerals are described as follows:
10: substrate; 11: isolation structure; 12: active area; 20: trench; 30: inversion doping layer; 31: side wall section; 32: bottom wall section; 40: oxide layer; 50: word line; 51: barrier layer; 52: conductive layer; 53: insulation layer; 60: protective layer; 70: first groove; 71: ion implantation region; 72: second groove; 73: barrier material layer; 74: conductive material layer; 75: third groove; 77: protective material layer; 76: insulation material layer.

DETAILED DESCRIPTION

Typical embodiments embodying features and advantages of the disclosure will be described in detail in the following description. It should be understood that there may be various changes in different embodiments of the disclosure, all of which do not depart from the scope of the disclosure. The descriptions and drawings therein are illustrative in nature, and are not intended to limit the disclosure.

The following description of different exemplary embodiments of the disclosure is made with reference to the accompanying drawings, which form a part of the disclosure, and in which different exemplary structures, systems and steps that can implement various aspects of the disclosure are shown by way of example. It should be understood that structures and functions may be modified by using other specific solutions of components, structures, exemplary devices, systems, and steps without departing from the scope of the disclosure. Moreover, although the terms "above", "between", "within", or the like may be used in the specification to describe different exemplary features and elements of the disclosure, these terms are used herein for convenience of description only, for example, according to directions of examples described in the drawings. Nothing in the specification should be understood as requiring a specific three-dimensional orientation of the structure to fall within the scope of the disclosure.

Figure 1:
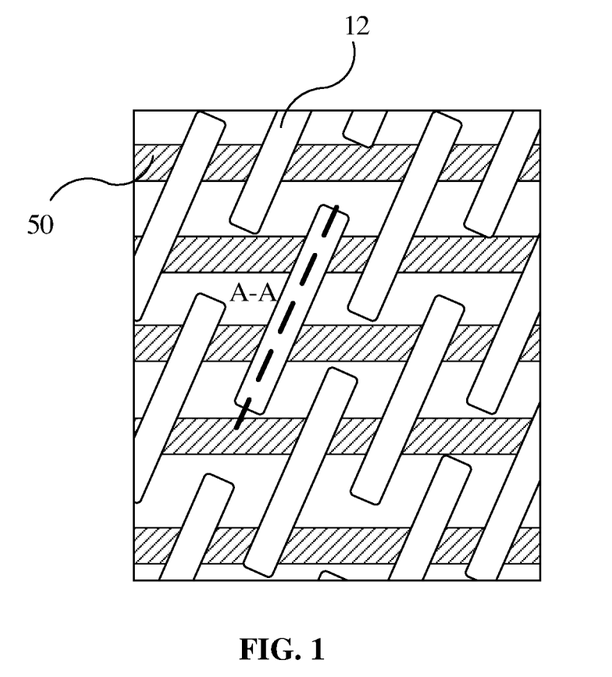
FIG. 1 is a schematic diagram of a semiconductor structure according to an exemplary embodiment.

One embodiment of the disclosure provides a semiconductor structure. Referring to FIG. 1, the semiconductor structure includes: a substrate 10, the substrate 10 including an isolation structure 11 and an active area 12, and the active area 12 including ions of a first type; a trench 20 arranged in the active area 12, an inner surface of the trench 20 including an inversion doping layer 30 and an oxide layer 40 which are arranged adjacent to each other, and the inversion doping layer 30 being arranged above the oxide layer 40; and a word line 50 arranged in the trench 20. The inversion doping layer 30 includes ions of a second type. The first type is contrary to the second type.

According to the semiconductor structure of one embodiment of the disclosure, the inversion doping layer 30 with a doping type contrary to a doping type of the active area 12 is formed in a wall of the trench 20, so as to form a shallow junction (i.e., a PN junction) to fix the active area 12 and offset part of the drain voltage, so that a peak electric field of a drain depletion area is improved, and a hot carrier tunneling is improved, thereby improving the performance of the semiconductor structure.

It should be noted that the inversion doping layer 30 is configured to form a side wall of the trench 20, and the oxide layer 40 is configured to form a side wall and a bottom wall of the trench 20. The word line 50 is filled in the trench 20, so as to form an embedded word line 50.

It should be noted that the contrary doping types can be understood as doping with P-type ions and N-type ions respectively, that is, doping with P-type ions and N-type ions corresponding to group III elements and group V elements. Regarding whether the irons of the first type are P-type ions or N-type ions, it is consistent with properties of a Metal Oxide Semiconductor Field Effect Transistor (MOSFET). That is, the first type of an NMOS is an N-type ion, and the first type of a PMOS is a P-type ion.

Specifically, the substrate 10 may be a P-type silicon substrate or an N-type silicon substrate.

For example, if the substrate 10 is of the N type, N-type ions (ions of group V elements, such as phosphorus P or arsenic As) are implanted to the silicon substrate to form the active area 12. If the ions of the first type are the N-type ions, the ions of the second type are the P-type ions (ions of group III elements, such as boron B or gallium Ga). In this case, P-type ions are implanted to the wall of the trench 20 to form the inversion doping layer 30. The P-type ions may also be boron di-fluoride BF2.

Alternatively, if the substrate 10 is of the P type, P-type ions (ions of group III elements, such as boron B or gallium Ga) are implanted to the silicon substrate to form the active area 12. If the ions of the first type are the P-type ions, the ions of the second type are the N-type ions (ions of group V elements, such as phosphorus P or arsenic As). In this case, N-type ions are implanted to the wall of the trench 20 to form the inversion doping layer 30.

Figure 2:
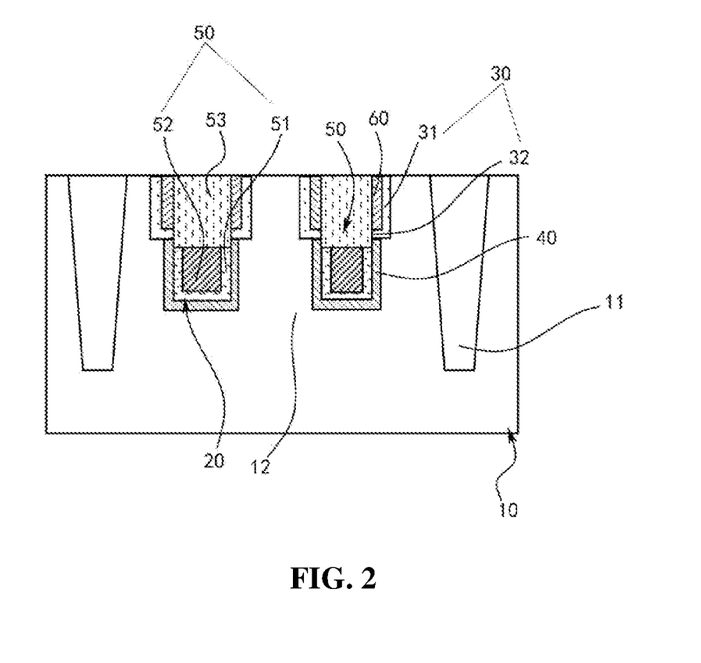
FIG. 2 is a schematic diagram of a portion A-A in FIG. 1.

In one embodiment, as shown in FIG. 1 and FIG. 2, a plurality of active areas 12 are provided in the substrate 10. The active areas 12 are filled between two adjacent isolation structures 11. A depth of each isolation structure 11 may be the same, or different from each other. It can be seen in combination with FIG. 1 that each word line 50 crosses over the plurality of active areas 12. There are multiple word lines 50.

In one embodiment, referring to FIG. 1, the plurality of active areas 12 are arranged in multiple rows parallel to each other. Each word line 50 crosses over the multiple rows of active areas 12. The distance between the sides of two adjacent active areas 12 in two adjacent rows is relatively small, while the distance between the ends of two adjacent active areas 12 in the same row is relatively large.

In one embodiment, the active area 12 includes a source area and a drain area. Referring to FIG. 2, the drain area is arranged between two adjacent word lines 50, and the source area is arranged between the isolation structure 11 and the word line 50.

In one embodiment, the isolation structure 11 may include silicon oxide, such as $SiO_2$.

In one embodiment, the oxide layer 40 may include $SiO_2$.

In one embodiment, a thickness of the oxide layer 40 is comprised between 3 nm and 8 nm.

In one embodiment, as shown in FIG. 2, an inner surface of the trench 20 further includes a protective layer 60. The protective layer 60 is in contact with the inversion doping layer 30. The inversion doping layer 30 is sandwiched between a bottom end of the protective layer 60 and a top end of the oxide layer 40. The protective layer 60 is configured to protect the inversion doping layer 30, so as to prevent the inversion doping layer 30 from being damaged during the manufacturing process of the semiconductor structure.

It should be noted that the protective layer 60 forms a side wall of the trench 20. That is, the protective layer 60 covers a portion of the inversion doping layer 30, so that the uncovered inversion doping layer 30 is sandwiched between the bottom end of the protective layer 60 and the top end of the oxide layer 40, thereby forming the side wall of the trench 20.

In one embodiment, the protective layer 60 may be SIO$_2$, SIN, or a combination thereof.

In one embodiment, a thickness of the protective layer 60 is comprised between 3 nm and 10 nm.

In one embodiment, as shown in FIG. 2, the inversion doping layer 30 includes a side wall section 31 in contact with the protective layer 60, and a bottom wall section 32 sandwiched between the bottom end of the protective layer 60 and the top end of the oxide layer 40. The bottom wall section is perpendicular to the side wall section 31. The protective layer 60, the bottom wall section 32 and the oxide layer 40 form the inner surface of the trench 20.

The inversion doping layer 30 is composed of the side wall section 31 and the bottom wall section 32. The protective layer 60 completely covers the side wall section 31, and the bottom end of the protective layer 60 is in contact with the bottom wall section 32, so that the protective layer 60, the bottom wall section 32 and the oxide layer 40 form the inner surface of the trench 20.

It should be noted that the inversion doping layer 30 and the oxide layer 40 may be formed in the substrate 10. That is, the inversion doped layer 30 may be formed by implanting the ions of the second type to the substrate 10 (an implantation dose of the ions of the second type is comprised between 5E13/cm$^2$ and 1.5E14/cm$^2$, and implantation energy of the ions of the second type is comprised between 0.5 KeV and 5 KeV). The oxide layer 40 may be formed in the substrate 10 through an In-Situ Steam Generation (ISSG) process. The protective layer 60 is formed on the surface of the substrate 10. For example, the protective layer 60 may be formed on the substrate 10 through a Physical Vapor Deposition (PVD) process, a Chemical Vapor Deposition (CVD) process or an Atomic Layer Deposition (ALD) process.

Alternatively, the inversion doped layer 30 may be formed by implanting the ions of the second type to the substrate 10. The oxide layer 40 may be formed on the surface of the substrate 10. For example, the oxide layer 40 may be formed on the substrate 10 through the Physical Vapor Deposition process, the Chemical Vapor Deposition process or the Atomic Layer Deposition process. Correspondingly, the protective layer 60 is formed on the surface of the substrate 10. For example, the protective layer 60 may be formed on the substrate 10 through the Physical Vapor Deposition process, the Chemical Vapor Deposition process or the Atomic Layer Deposition process.

In one embodiment, the bottom end of the protective layer 60 is in contact with the bottom wall section 32, and the top end of the oxide layer 40 is in contact with the bottom wall section 32, so that the protective layer 60, the bottom wall section 32 and the oxide layer 40 form the inner surface of the trench 20.

In one embodiment, the projection of each of the side wall of the protective layer 60, the side wall of the bottom wall section 32, and the side wall of the oxide layer 40 facing to the substrate 10 coincide with each other. That is, the word line 50 in the trench 20 is of a structure with a constant cross-sectional area.

Specifically, for example, if the trench 20 is a circular hole, a diameter of the circular hole remains unchanged along an extending direction of the circular hole, thereby facilitating the manufacture of the semiconductor structure.

In one embodiment, as shown in FIG. 2, the word line 50 includes: a barrier layer 51 arranged on the surface of the oxide layer 40; and a conductive layer 52 arranged on a surface of the barrier layer 51. The arrangement of the barrier layer 51 can prevent diffusion of the conductive material forming the conductive layer 52.

In one embodiment, as shown in FIG. 2, the semiconductor structure further includes an insulation layer 53. The insulation layer 53 is arranged above the barrier layer 51 and the conductive layer 52. Each of a top end of the barrier layer 51 and a top end of the conductive layer 52 is in contact with a bottom end of the insulation layer 53. The insulation layer 53 is configured to form a good insulation structure.

In one embodiment, the barrier layer 51 may include Ta, Ti, Ru, TaN, TiN, RuTa, RuTaN, W, Ir, or the like. The barrier layer 51 may be made of any other materials that prevent the conductive material layer from diffusing.

In one embodiment, a thickness of the barrier layer 51 may be comprised between 2 nm and 7 nm.

In one embodiment, the conductive layer 52 may be made of a metal material, such as Cu, Al, W or alloy thereof.

In one embodiment, the insulation layer 53 may be formed of a material including silicon oxide, silicon nitride, or a combination thereof. For example, the insulation layer 53 may be SIN, SION, or SIO$_2$.

In one embodiment, the barrier layer 51 covers a side wall and a bottom wall of the oxide layer 40. A plane where the top end of the barrier layer 51 is located is lower than a plane where the bottom end of the protective layer 60 is located.

Specifically, the plane where the top end of the barrier layer 51 is located is 10 nm to 20 nm lower than the plane where the bottom end of the protective layer 60 is located.

In one embodiment, the barrier layer 51 completely covers a side surface and a bottom surface of the conductive layer 52, so as to ensure an effective barrier effect.

In one embodiment, the top end of the conductive layer 52 and the top end of the barrier layer 51 are not in the same plane. For example, the top end of the conductive layer 52 is higher than the top end of the barrier layer 51.

In one embodiment, the top end of the barrier layer 51 is flush with the top end of the conductive layer 52. That is, the bottom end of the insulation layer 53 is a plane, so that the bottom end of the insulation layer is reliably in contact with the top end of the barrier layer 51 and the top end of the conductive layer 52.

Specifically, through analysis in combination with FIG. 2, the barrier layer 51 is arranged on the oxide layer 40, that is, the barrier layer 51 is arranged below the inversion doping layer 30. The top end of the barrier layer 51 may be flush with the top end of the oxide layer 40, or the top end of the barrier layer 51 is lower than the top end of the oxide layer 40. Therefore, the insulation layer 53 completely covers the protective layer 60 and the bottom wall section 32 of the inversion doping layer 30.

Figure 3:
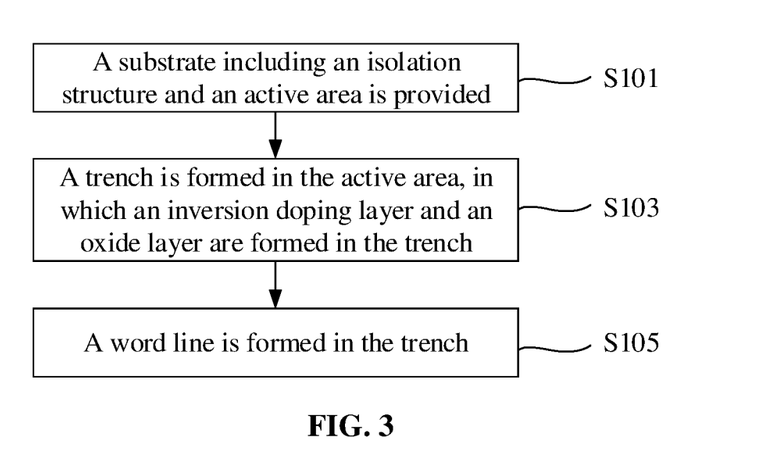
FIG. 3 is a flowchart of a method for manufacturing a semiconductor structure according to one exemplary embodiment.

One embodiment of the disclosure further provides a method for manufacturing a semiconductor structure. Referring to FIG. 3, the method for manufacturing the semiconductor structure includes the following operations.

In S101, a substrate 10 including an isolation structure 11 and an active area 12 is provided. The active area 12 is doped with ions of a first type.

In S103, a trench 20 is formed in the active area 12. An inversion doping layer 30 and an oxide layer 40 are formed in the trench 20. The inversion doping layer 30 is arranged above the oxide layer 40.

In S105, a word line 50 is formed in the trench 20.

The inversion doping layer 30 is doped with ions of a second type. The first type is contrary to the second type.

According to the method for manufacturing the semiconductor structure of one embodiment of the disclosure, the inversion doping layer 30 with a doping type contrary to a doping type of the active area 12 is formed in a wall of the trench 20, so as to form a shallow junction (i.e., a PN junction) to fix the active area 12 and offset part of the drain voltage, so that a peak electric field of a drain depletion area is improved, and a hot carrier tunneling is improved, thereby improving the performance of the semiconductor structure.

Figure 4:
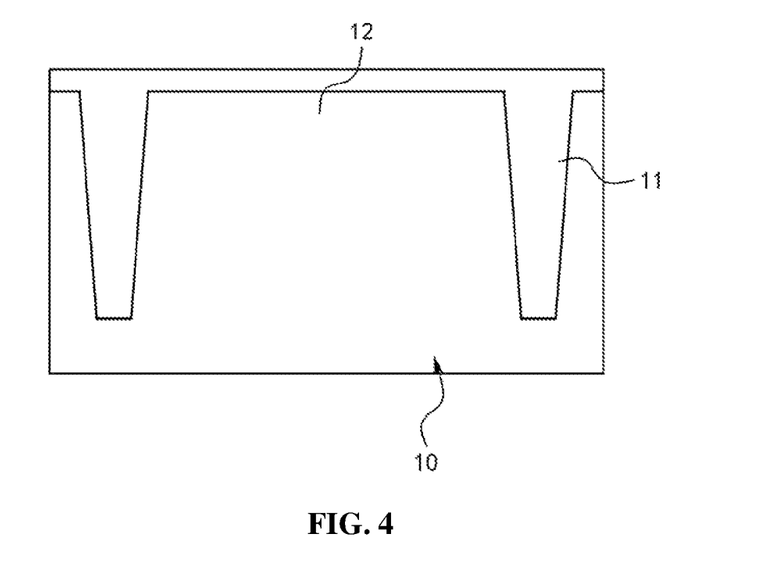
FIG. 4 is a schematic diagram of a substrate provided in a method for manufacturing a semiconductor structure according to one exemplary embodiment.

It should be noted that as shown in FIG. 4, the provided substrate 10 is a substrate 10 including an isolation structure 11 and an active area 12. That is, the trench 20 is directly formed on the substrate 10 without considering a specific forming method of the isolation structure 11 and the active area 12, and the word line 50 is formed. Before the trench 20 is formed, the substrate 10 may be planarized through dry etching or Chemical Mechanical Polishing (CMP). An upper surface of the substrate 10 may be provided with a layer of protective structure, such as an oxide layer.

It should be noted that the word line 50 is an embedded word line.

In one embodiment, the operation that the trench 20 is formed in the active area 12 includes the following operations. A first groove 70 is formed in the active area 12. The ions of the second type are implanted to an inner surface of the first groove 70 to form an ion implantation region 71. A surface of the ion implantation region 71 is covered with a protective material layer 77. A bottom portion of the protective material layer 77, a bottom portion of the ion implantation region 71 and a bottom portion of the first groove 70 are etched to form a second groove 72. A remaining part of the ion implantation region 71 is configured as the inversion doping layer 30, and a remaining part of the protective material layer 77 is configured as a protective layer 60. The oxide layer 40 is formed on an inner surface of the second groove 72. The protective layer 60, the inversion doping layer 30 and the oxide layer 40 form an inner surface of the trench 20.

For the formation of the trench 20, the first groove 70 and the second groove 72 should be sequentially formed. Furthermore, an inner surface of the first groove 70 is treated with the ions of the second type and the protective material layer 77, and the oxide layer 40 is formed on the inner surface of the second groove 72, thereby forming the inner surface of the trench 20.

In one embodiment, a depth of the first groove 70 is comprised between 30 nm and 80 nm, and/or a depth of the second groove 72 is comprised between 50 nm and 100 nm.

In one embodiment, after the ion implantation region 71 is formed and before the second groove 72 is formed, the method further includes the following operations. The protective material layer 77 is formed to cover the inner surface of the first groove 70 and a surface of the substrate 10. The protective material layer 77 on the surface of the substrate 10 and at the bottom portion of the first groove 70 is etched, so as to expose the substrate 10 and the ion implantation region 71.

Specifically, the formation of the trench 20 is described with reference to FIG. 4 to FIG. 9.

As shown in FIG. 4, the substrate 10 including the isolation structure 11 and the active area 12 is provided.

Figure 5:
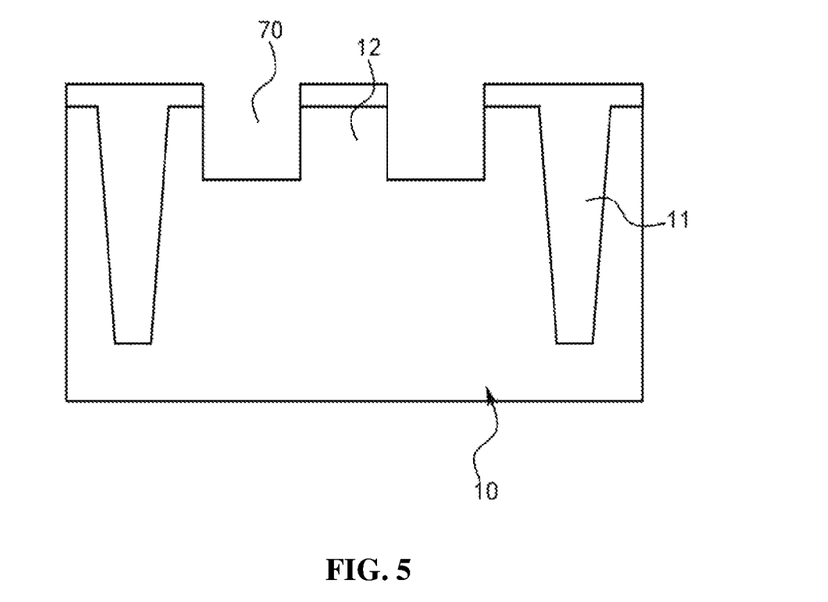
FIG. 5 is a schematic diagram after forming a first groove in a method for manufacturing a semiconductor structure according to one exemplary embodiment.

As shown in FIG. 5, the first groove 70 is formed on the substrate 10. That is, the first groove 70 is formed in the active area 12. The depth of the first groove 70 may be comprised between 30 nm and 80 nm, and a width of the first groove is comprised between 30 nm and 60 nm. The process of the first groove 70 is not limited, and a proper process in the related technology can be used, such as etching.

Figure 6:
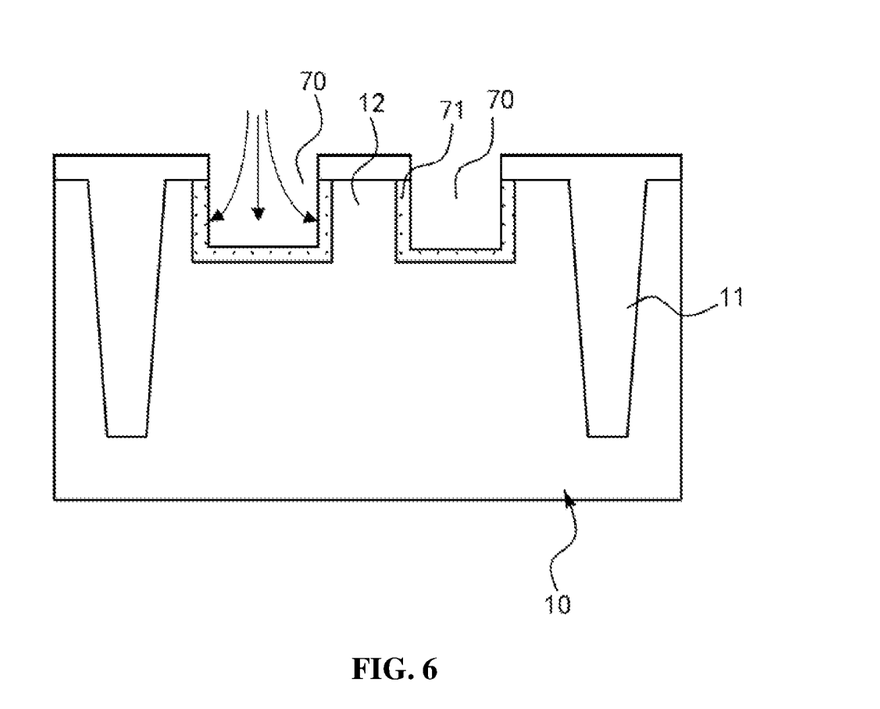
FIG. 6 is a schematic diagram after forming an ion implantation region in a method for manufacturing a semiconductor structure according to one exemplary embodiment.

As shown in FIG. 6, the ions of the second type are implanted to the substrate 10 via the first groove 70, so that the ion implantation region 71 is formed in the substrate 10. The ion implantation region 71 forms the inner surface of the first groove 70. If the substrate 10 is of an N type, the ions of the second type are P-type ions, such as boron B, gallium Ga, and boron di-fluoride BF2. Alternatively, if the substrate 10 is of a P type, the ions of the second type are N-type ions, such as phosphorus P or arsenic As.

Figure 7:
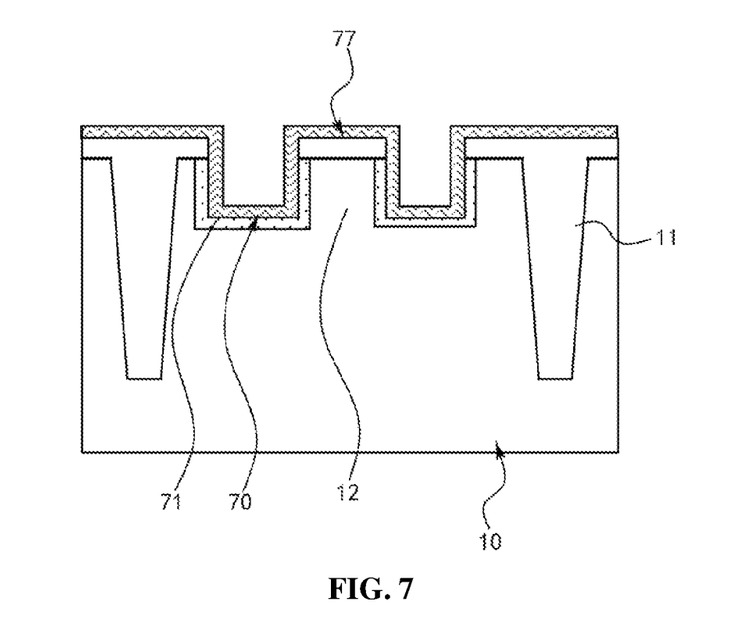
FIG. 7 is a schematic diagram after covering a protective material layer in a method for manufacturing a semiconductor structure according to one exemplary embodiment.

As shown in FIG. 7, the protective material layer 77 is formed through the Physical Vapor Deposition process, the Chemical Vapor Deposition process or the Atomic Layer Deposition process. The protective material layer 77 covers the inner surface of the first groove 70 and an upper surface of the substrate 10. The protective material layer 77 may be $SIO_2$, SIN, or a combination thereof. The thickness of the protective material layer 77 is comprised between 3 nm and 10 nm.

Figure 8:
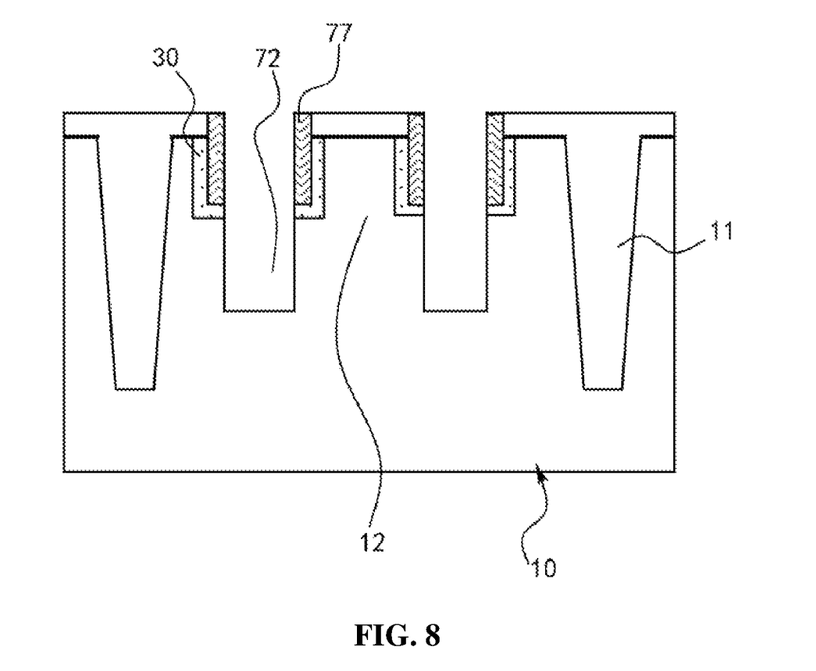
FIG. 8 is a schematic diagram after forming a second groove in a method for manufacturing a semiconductor structure according to one exemplary embodiment.

As shown in FIG. 8, the protective material layer 77 covering the upper surface of the substrate 10 is etched to expose the upper surface of the substrate 10. The protective material layer 77 is etched in an extending direction of the first groove 70. That is, only the protective material layer 77 extending in a vertical direction is remained. After the ion implantation region 71 in a horizontal direction is exposed, the protective material layer is continuously etched downward until the second groove 72 is formed. In this case, the remaining part of the ion implantation region 71 is configured as the inversion doping layer 30. The second groove 72 is formed below the first groove 70. The depth of the second groove 72 may be comprised between 50 nm and 100 nm, and a width of the second groove may be comprised between 15 nm and 50 nm.

Figure 9:
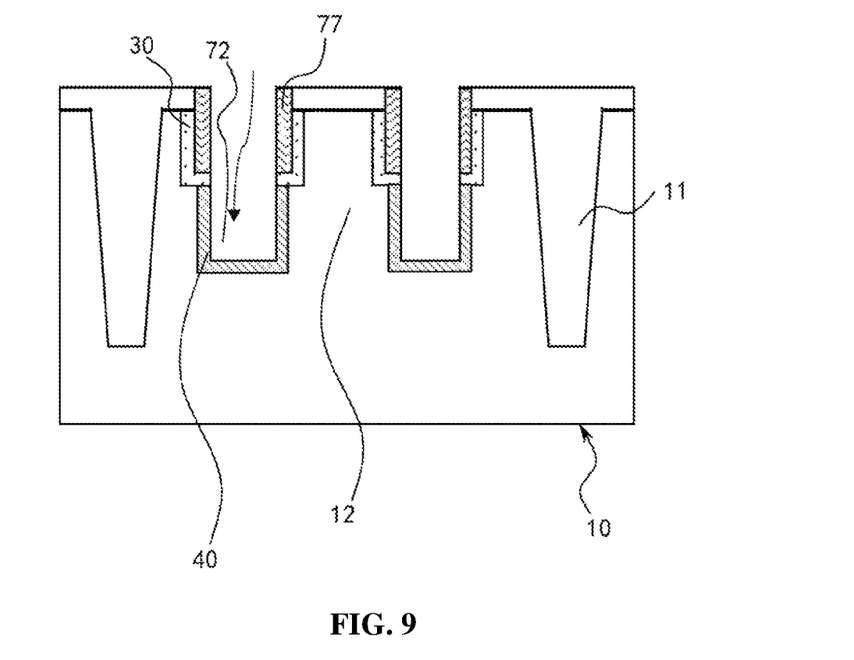
FIG. 9 is a schematic diagram after forming an oxide layer in a method for manufacturing a semiconductor structure according to one exemplary embodiment.

As shown in FIG. 9, the oxide layer 40 is formed on the inner surface of the second groove 72 through the In-Situ Steam Generation process. In this case, the trench 20 is formed. The oxide layer 40 includes $SIO_2$, and the thickness of the oxide layer 40 may be comprised between 3 nm and 8 nm.

In one embodiment, an implantation dose of the ions of the second type is comprised between $5E13/cm^2$ and $1.5E14/cm^2$, and implantation energy of the ions of the second type is comprised between 0.5 KeV and 5 KeV.

In one embodiment, the operation that the word line 50 is formed in the trench 20 includes the following operations. A barrier material layer 73 is formed to cover the inner surface of the trench 20. A conductive material layer 74 is formed on a surface of the barrier material layer 73, and the trench 20 is filled. The conductive material layer 74 and the barrier material layer 73 are etched to sequentially expose the protective layer 60 and the inversion doping layer 30 between the protective layer 60 and the oxide layer 40, so as to form a third groove 75. A remaining part of the conductive material layer 74 is configured as a conductive layer 52, and a remaining part of the barrier material layer 73 is configured as a barrier layer 51. An insulation material layer 76 is formed on an inner surface of the third groove 75 and a surface of the substrate 10. The insulation material layer 76 on the surface of the substrate 10 is etched to expose a top end of the inversion doping layer 30 and a top end of the protective layer 60. A remaining part of the insulation material layer 76 is configured as an insulation layer 53. The barrier layer 51 and the conductive layer 52 form the word line 50, and the insulation layer 53 is arranged above the word line 50.

For the forming process of the word line 50, the barrier layer 51, the conductive layer 52 and the insulation layer 53 should be formed sequentially.

In one embodiment, a depth of the third groove 75 is 10 nm to 20 nm greater than a depth of the first groove 70.

In one embodiment, the depth of the third groove 75 is comprised between 40 nm and 80 nm.

Specifically, the forming process of the word line 50 is described with reference to FIG. 10 to FIG. 13.

Figure 10:
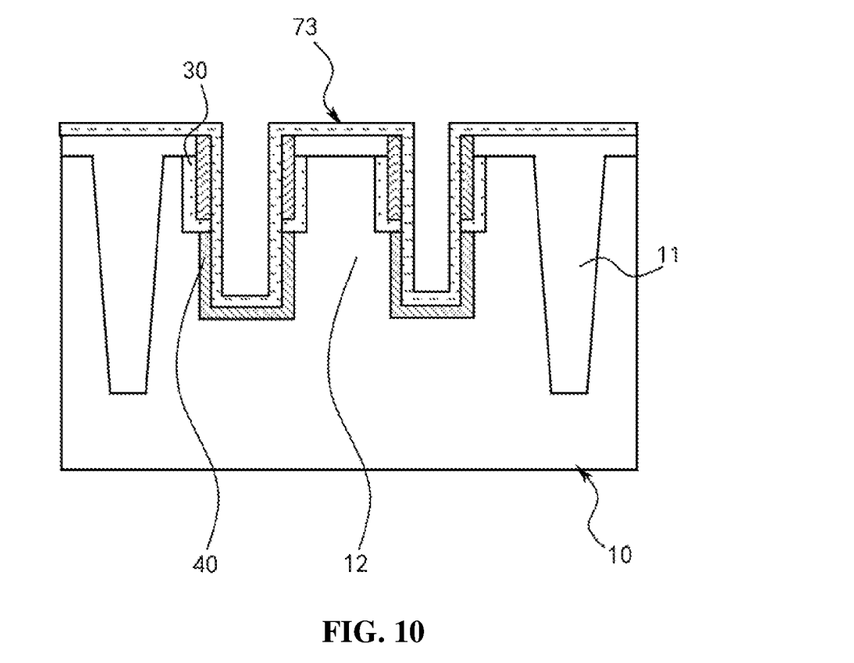
FIG. 10 is a schematic diagram after covering a barrier material layer in a method for manufacturing a semiconductor structure according to one exemplary embodiment.

As shown in FIG. 10, the barrier material layer 73 is formed through the Physical Vapor Deposition process, the Chemical Vapor Deposition process or the Atomic Layer Deposition process. The barrier material layer 73 covers the inner surface of the trench 20 and the upper surface of the substrate 10. The barrier material layer 73 may include Ta, Ti, Ru, TaN, TiN, RuTa, RuTaN, W, or Ir. The barrier material layer 73 may be made of any other material that prevents the conductive material layer from diffusing. The thickness of the barrier material layer 73 may be comprised between 2 nm and 7 nm.

Figure 11:
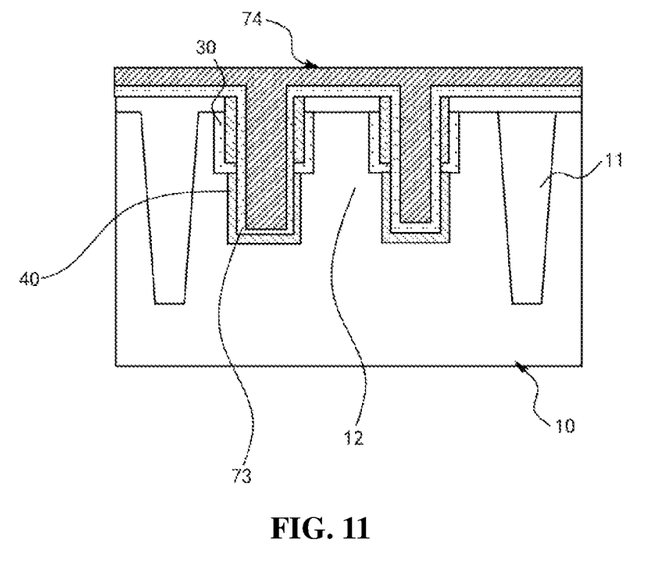
FIG. 11 is a schematic diagram after covering a conductive material layer in a method for manufacturing a semiconductor structure according to one exemplary embodiment.

As shown in FIG. 11, the conductive material layer 74 is formed through the Physical Vapor Deposition process, the Chemical Vapor Deposition process or the Atomic Layer Deposition process. The conductive material layer 74 is filled in a space formed by the barrier material layer 73 and covers the barrier material layer 73 arranged on the upper surface of the substrate 10. The upper surface of the conductive material layer 74 is planatized through dry etching or Chemical Mechanical Polishing (CMP). The conductive layer 52 may be made of a metal material, such as Cu, Al, W or alloy thereof.

Figure 12:
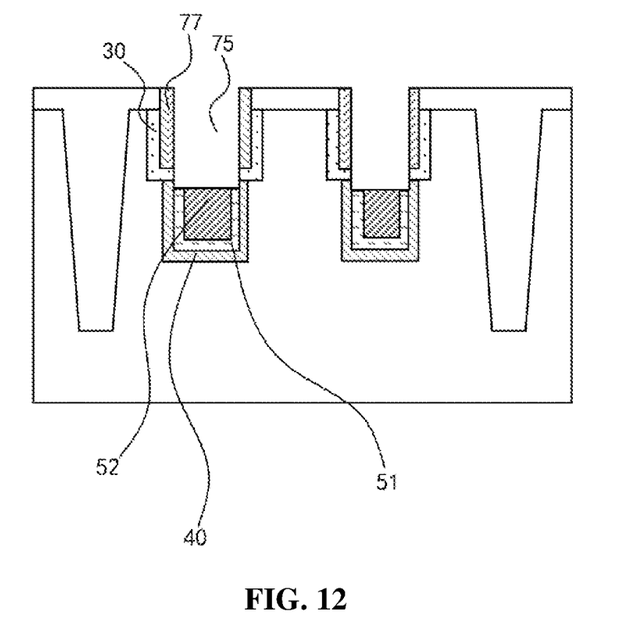
FIG. 12 is a schematic diagram after forming a third groove in a method for manufacturing a semiconductor structure according to one exemplary embodiment.

As shown in FIG. 12, the conductive material layer 74 and the barrier material layer 73 on the upper surface of the substrate 10 are etched, and the conductive material layer 74 and the barrier material layer 73 in the trench 20 are etched, so as to expose the bottom wall section 32 of the inversion doping layer 30. In this case, the remaining part of the conductive material layer 74 is configured as the conductive layer 52, and the remaining part of the barrier material layer 73 is configured as the barrier layer 51. The third groove 75 is formed above the conductive layer 52 and the barrier layer 51. The depth of the third groove 75 may be comprised between 40 nm and 80 nm. That is, the bottom end of the third groove 75 should be lower than the bottom end of the first groove 70. The depth of the third groove 75 is 10 nm to 20 nm greater than the depth of the first groove 70.

Figure 13:
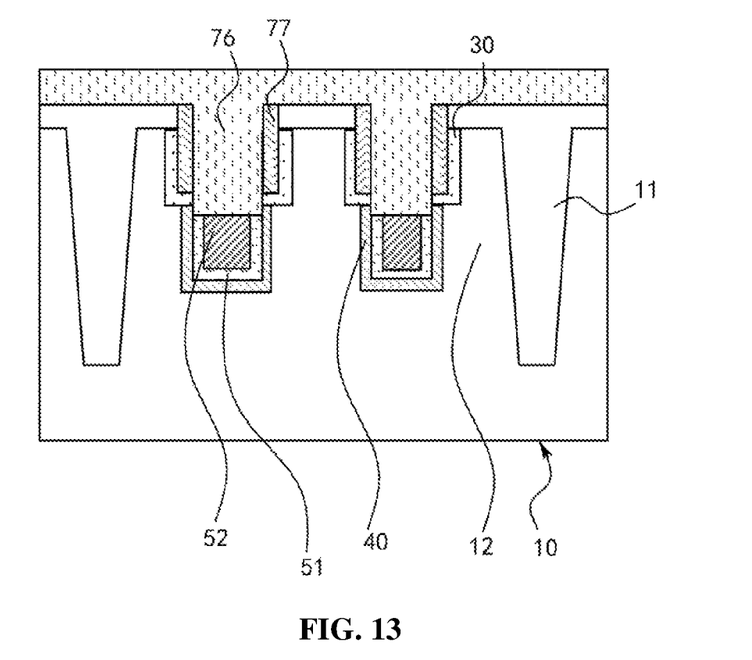
FIG. 13 is a schematic diagram after covering an insulation material layer in a method for manufacturing a semiconductor structure according to one exemplary embodiment.

As shown in FIG. 13, the insulation material layer 76 is formed through the Physical Vapor Deposition process, the Chemical Vapor Deposition process or the Atomic Layer Deposition process. The insulation material layer 76 is filled in the third groove 75 and covers the upper surface of the substrate 10. The insulation material layer 76 may be SIN, SION or $SIO_2$.

The insulation material layer 76 is planarized through dry etching or Chemical Mechanical Polishing. Finally, the insulation material layer 76 is etched. The remaining part of the insulation material layer 76 is configured as the insulation layer 53, and the semiconductor structure as shown in FIG. 2 is formed.

It should be noted that the upper surface of the substrate 10 may be provided with a protective structure. Thus, at the end of the forming process, the protective structure should be removed. When the insulation material layer 76 on the upper surface of the substrate 10 is removed, the protective structure as well as the protective material layer 77 and the insulation material layer 76 in the protective structure should also be removed.

Other embodiments of the disclosure will be apparent to those skilled in the art from consideration of the specification and practice of the disclosure disclosed here. The disclosure is intended to cover any variations, uses, or adaptations of the disclosure following the general principles thereof and including such departures from the disclosure as come within known or customary practice in the art. It is intended that the specification and embodiments are considered as exemplary only, with a true scope and spirit of the disclosure being indicated by the claims.

It should be understood that the disclosure is not limited to the exact construction that has been described above and illustrated in the accompanying drawings, and that various modifications and changes can be made without departing from the scope thereof. It is intended that the scope of the disclosure is only limited by the appended claims.

The invention claimed is:

1. A semiconductor structure, comprising:
   a substrate comprising an isolation structure and an active region, the active region comprising ions of a first type;
   a trench arranged in the active region, an inner surface of the trench comprising an inversion doping layer and an oxide layer which are arranged adjacent to each other, and the oxide layer being arranged between the inversion doping layer and the active region; and
   a word line arranged in the trench,
   wherein the inversion doping layer comprises ions of a second type, and the first type is contrary to the second type; and
   wherein the inner surface of the trench further comprises:
   a protective layer in contact with the inversion doping layer, the inversion doping layer being sandwiched between a bottom end of the protective layer and a top end of the oxide layer.

2. The semiconductor structure of claim 1, wherein the inversion doping layer comprises:
   a side wall section in contact with the protective layer; and
   a bottom wall section sandwiched between the bottom end of the protective layer and the top end of the oxide layer, the bottom wall section being perpendicular to the side wall section,
   wherein the protective layer, the bottom wall section and the oxide layer form the inner surface of the trench.

3. The semiconductor structure of claim 2, wherein each of the bottom end of the protective layer and the top end of the oxide layer is in contact with the bottom wall section.

4. The semiconductor structure of claim 1, wherein the word line comprises:
   a barrier layer arranged on a surface of the oxide layer, and
   a conductive layer arranged on a surface of the barrier layer.

5. The semiconductor structure of claim 2, wherein the word line comprises:
   a barrier layer arranged on a surface of the oxide layer, and
   a conductive layer arranged on a surface of the barrier layer.

6. The semiconductor structure of claim 3, wherein the word line comprises:
   a barrier layer arranged on a surface of the oxide layer, and
   a conductive layer arranged on a surface of the barrier layer.

7. The semiconductor structure of claim 4, wherein a top end of the barrier layer is flush with a top end of the conductive layer.

8. A semiconductor structure, comprising:
   a substrate comprising an isolation structure and an active region, the active region comprising ions of a first type;
   a trench arranged in the active region, an inner surface of the trench comprising an inversion doping layer and an oxide layer which are arranged adjacent to each other, and the inversion doping layer being arranged above the oxide layer; and a word line arranged in the trench, wherein the inversion doping layer comprises ions of a second type, and the first type is contrary to the second type;

wherein the inner surface of the trench further comprises:

a protective layer in contact with the inversion doping layer, the inversion doping layer being sandwiched between a bottom end of the protective layer and a top end of the oxide layer;

wherein the word line comprises:

a barrier layer arranged on a surface of the oxide layer, and a conductive layer arranged on a surface of the barrier layer; and the semiconductor structure further comprising:

an insulation layer arranged above the barrier layer and the conductive layer, each of a top end of the barrier layer and a top end of the conductive layer being in contact with a bottom end of the insulation layer, wherein the barrier layer covers a side wall and a bottom wall of the oxide layer, and a plane where the top end of the barrier layer is located is lower than a plane where the bottom end of the protective layer is located.

9. The semiconductor structure of claim 8, wherein the plane where the top end of the barrier layer is located is 10 nm to 20 nm lower than the plane where the bottom end of the protective layer is located.

* * * * *